US011551843B2

United States Patent
Hinderer et al.

(10) Patent No.: US 11,551,843 B2
(45) Date of Patent: Jan. 10, 2023

(54) METHOD FOR MAGNETIZING A SUPERCONDUCTOR BULK MAGNET, WITH GENERATING AN AUXILIARY MAGNETIC FIELD IN THE SUPERCONDUCTOR BORE

(71) Applicant: Bruker Switzerland AG, Faellanden (CH)

(72) Inventors: Joerg Hinderer, Waldshut-Tiengen (DE); Stephen Alfred March, Zurich (CH); Franck Borgnolutti, Duebendorf (CH)

(73) Assignee: BRUKER SWITZERLAND AG, Faellanden (CH)

( * ) Notice: Subject to any disclaimer, the term of this patent is extended or adjusted under 35 U.S.C. 154(b) by 511 days.

(21) Appl. No.: 16/689,145

(22) Filed: Nov. 20, 2019

(65) Prior Publication Data
US 2020/0161039 A1 May 21, 2020

(30) Foreign Application Priority Data
Nov. 20, 2018 (EP) .................................. 18207267

(51) Int. Cl.
*G01R 33/3875* (2006.01)
*H01F 13/00* (2006.01)
(Continued)

(52) U.S. Cl.
CPC ..... *H01F 13/003* (2013.01); *G01R 33/34023* (2013.01); *G01R 33/3875* (2013.01); *H01F 6/04* (2013.01)

(58) Field of Classification Search
CPC ............ H01F 6/00–6/065; H01F 13/00; G01R 33/3875
See application file for complete search history.

(56) References Cited

U.S. PATENT DOCUMENTS

| 6,169,401 B1 | 1/2001 | Oka et al. |
| 6,545,474 B2 | 4/2003 | Nakamura et al. |

(Continued)

FOREIGN PATENT DOCUMENTS

| DE | 10130677 A1 | 1/2002 |
| DE | 19908433 C2 | 6/2003 |

(Continued)

*Primary Examiner* — Ramon M Barrera
(74) *Attorney, Agent, or Firm* — Edell, Shapiro & Finnan, LLC

(57) ABSTRACT

A superconductor bulk magnet magnetizing method providing a more homogenous trapped magnetic field includes: placing the bulk magnet inside a charger bore of an electrical charger magnet; placing a field correction unit inside a superconductor bore of the bulk magnet; applying an electrical current ($I_0$) to the charger magnet, to generate an externally applied magnetic field, wherein a temperature $T_{bulk}$ of the bulk magnet exceeds a bulk magnet critical temperature $T_c$; applying an auxiliary electrical current ($I_1$, . . . ) to the field correction unit, thus generating an auxiliary magnetic field applied to the bulk magnet from within the superconductor bore, wherein $T_{bulk} > T_c$; lowering $T_{bulk}$ below $T_c$; turning off the electrical current at the charger magnet, wherein $T_{bulk} < T_c$, and turning off the auxiliary electrical current at the field correction unit, wherein $T_{bulk} < T_c$; and removing the bulk magnet from the charger bore while $T_{bulk} < T_c$.

18 Claims, 7 Drawing Sheets

(51) Int. Cl.
*G01R 33/34* (2006.01)
*H01F 6/04* (2006.01)

(56) References Cited

U.S. PATENT DOCUMENTS

| | | |
|---|---|---|
| 7,859,374 B2 | 12/2010 | Iwasa et al. |
| 8,228,148 B2 | 7/2012 | Iwasa et al. |
| 8,948,829 B2 | 2/2015 | Morita et al. |
| 9,564,262 B2 | 2/2017 | Ito et al. |
| 2008/0180105 A1 | 7/2008 | Du et al. |
| 2016/0069968 A1* | 3/2016 | Rothberg ........... G01R 33/3804 324/322 |

FOREIGN PATENT DOCUMENTS

| | | | |
|---|---|---|---|
| JP | H0974012 A | | 3/1997 |
| JP | 2000262486 A | | 9/2000 |
| JP | 2014053479 A | | 3/2014 |
| JP | 2016168265 A | * | 9/2016 |
| WO | 2015015892 A1 | | 2/2015 |

* cited by examiner

METHOD FOR MAGNETIZING A SUPERCONDUCTOR BULK MAGNET, WITH GENERATING AN AUXILIARY MAGNETIC FIELD IN THE SUPERCONDUCTOR BORE

CROSS REFERENCE TO RELATED APPLICATIONS

This application claims foreign priority under 35 U.S.C. § 119(a)-(d) to European Patent Application EP 18207267.8 filed on Nov. 20, 2018, and the contents of which are incorporated into the present application by reference in their entirety.

FIELD OF THE INVENTION

The invention relates to a method for magnetizing a superconductor bulk magnet, with the following steps:
step a) placing the superconductor bulk magnet inside a charger bore of an electrical charger magnet; followed by
step b) applying at least one electrical current to the charger magnet, thus generating with the charger magnet a magnetic field which is applied to the superconductor bulk magnet from the outside, wherein a temperature $T_{bulk}$ of the superconductor bulk magnet is above a critical temperature $T_c$ of the superconductor bulk magnet; followed by
step c) lowering the temperature $T_{bulk}$ of the superconductor bulk magnet below the critical temperature $T_c$ of the superconductor bulk magnet; followed by
step d) turning off the at least one electrical current at the charger magnet, wherein $T_{bulk} < T_c$; followed by
step e) removing the superconductor bulk magnet from the charger bore and keeping $T_{bulk} < T_c$.

BACKGROUND

Such a method is known from U.S. Pat. No. 7,859,374 B2.

Superconductors may carry an electrical current at practically no ohmic losses. Superconductors are, for example, used to generate magnetic fields of high strength, in particular for use in nuclear magnetic resonance (=NMR) applications. Superconductors have to be exposed to cryogenic temperatures, though, since superconductivity is only assured below a critical temperature $T_c$, which is specific for the superconductor material.

Common superconductor applications use superconductor lines, such as tape shaped or wire shaped superconductor lines. The superconductor lines may be used directly (for example for current transport) or after having been brought in a desired form, for example by winding coils. In particular, superconductor coils for high field applications are typically made from superconductor lines wound in a solenoid type fashion.

However, superconductor bulk magnets are also known. In this case, a superconducting current circulates inside a piece or stacked pieces of superconductor, with the superconductor bulk magnet often being of closed ring shape. Such structures are simple and inexpensive to produce, and are often made from high temperature superconductor (=HTS) material.

Superconductor bulk magnets may be loaded by a procedure called "field-cooling", e.g. described in U.S. Pat. No. 7,859,374 B2. For this procedure, the superconductor bulk magnet is disposed inside the charger bore of an electrical charger magnet, and then the charger magnet is turned on and generates a magnetic field while the superconductor bulk magnet's temperature $T_{bulk}$ is still above $T_c$. Then the superconductor bulk magnet is cooled below $T_c$ and becomes superconducting. Subsequently, with $T_{bulk}$ kept below $T_c$, the charger magnet is turned off; accordingly, a current is induced in the superconductor bulk magnet, such that the magnetic flux within the superconductor bulk magnet is maintained. In other words, the superconductor bulk magnet traps the magnetic field in its inside. Then the superconductor bulk magnet may be removed from the charger magnet, and may be transported to a place where the trapped magnetic field may be used.

Superconductor bulk magnets have been proposed for NMR applications, compare DE 199 08 433 C2. For many applications, such as said NMR applications, a high homogeneity of a magnetic field is desirable. However, the typical magnetic field of a superconductor bulk magnet magnetized via the field-cooling process and provided in its superconductor bore has a relatively low homogeneity.

It is well known to use electrical shim coils to correct an inhomogeneous magnetic field during its use, such as during NMR measurements. Typically, the electrical shim coils are arranged in a room temperature bore of a cryostat enclosing the superconductor magnet.

However, shim coils allow only the correction of relatively small field inhomogeneities, since the shim coils become hot when too much electrical current is applied, what damages the shim coils and possibly also a sample. In U.S. Pat. No. 9,564,262 B2, an electrical shim coil system within the cryostat of the superconductor bulk magnet is proposed; however then the shim coil system introduces heat into the cryostat, making its operation expensive or possibly overloading the cooling capacity installed at the cryostat.

Another common approach is to shape the superconductor bulk magnet in a variety of ways in order to improve the homogeneity of the resulting magnetic field, compare for example U.S. Pat. No. 8,948,829 B2 or U.S. Pat. No. 8,228,148 B2 or U.S. Pat. No. 9,564,262 B2. Although these approaches improve the magnetic field homogeneity, they are difficult and expensive to put into practice, and their improvement effect is limited.

WO 2015/015892 A1 proposes to arrange a superconducting bulk to be magnetized within the bore of large magnetization unit, and to further arrange in said bore of the large magnetization unit a magnetic field adjusting unit, with its coils arranged outside about the superconducting bulk. The superconducting bulk is magnetized using both the magnetization unit and the magnetic field adjusting unit.

SUMMARY

It is an object of the present invention to provide a method of magnetizing a superconducting bulk magnet, with which a higher homogeneity of the trapped magnetic field of the superconducting bulk magnet can be obtained than heretofore. It is a further object to obtain this higher homogeneity in a relatively simple way.

According to one formulation of the invention, these objects are achieved by a method as introduced in the beginning, characterized by the method further including the steps of
step a') placing a field correction unit at least partially inside a superconductor bore of the superconductor bulk magnet, such that a correction coil system of the field correction unit is located at least partially within the superconductor bore; and
step b') applying at least one auxiliary electrical current to the field correction unit, thus generating with the field correction unit an auxiliary magnetic field which is applied to the superconductor bulk magnet from within the superconductor bore, wherein $T_{bulk} > T_c$, with step a') being performed before step b') and step b') being performed before step c); and step d') turning off the at least one auxiliary electrical current at the field correction unit, wherein $T_{bulk} < T_c$, with step d') being performed after step c).

The present invention proposes to include an auxiliary magnetic field into the field-cooling process for magnetizing the superconductor bulk magnet. The superconductor bulk magnet is exposed to both a magnetic field generated by an outside charger magnet, and the auxiliary magnetic field generated by a field correction unit with a correction coil system within the superconductor bore. In this way, both a radially outer part of the superconductor bulk magnet, as well as a radially inner part of the superconductor bulk magnet, will carry induced currents which in turn generate the magnetic field trapped by the cold superconductor bulk magnet. Through operation of the induced currents on the radially inner part of the superconductor bulk magnet, a significant improvement in field homogeneity of the trapped magnetic field may be achieved, in particular by iteratively optimizing the auxiliary magnetic field applied during the field-cooling process.

Note that in general, a high homogeneity level (such as 100 ppm or better, or even 10 ppm or better) of the trapped magnetic field is only required and established in a small volume inside the superconductor bore, often referred to as a sample volume SV, typically with $SV \leq 1$ cm$^3$, and often $SV \leq 0.5$ cm$^3$ or $SV \leq 0.2$ cm$^3$; the sample volume is however large enough to receive a typical sample, typically with $SV \geq 1$ mm$^3$, and often $SV \geq 2$ mm$^3$ or $SV \geq 5$ mm$^3$.

When a superconductor bulk magnet, such as a stack of ReBCO bulk rings, undergoes "field-cooling" in an external magnetic field, which is then ramped down to zero, the magnetic flux inside the superconductor bore, such as the inner bore of the rings, is preserved, and a magnetic field profile that is very close to the originally applied field profile is trapped (conserved). This happens as a consequence of the induced circular currents that flow in azimuthal direction around the superconductor bore within the superconductor bulk magnet. When ramping down the external magnetic field of an outside charger magnet, the induced currents build up from the outside inwards, i.e. the first current that is induced flows just below the outer surface of the superconductor bulk magnet, and a current front moves inward as more current is induced in order to keep the local current density just below the critical value $J_c$ at every point of time and at every location within the superconductor bulk magnet.

As a result, at the end of the magnetization procedure, a radial innermost part of the superconductor bulk magnet (or its superconductor bulk material, respectively) is generally at zero current density. This is necessary because if all the superconductor bulk material was charged with electrical current close to the (local) critical current, local quenching would begin since the current could no more evade a local spot of (temporarily) bad current carrying capacity, and the whole flux distribution would become unstable. Accordingly, a finite layer (or stabilizing volume) of current-less superconductor bulk material on the inside (i.e. adjacent to the superconductor bore) is therefore necessary for a stable magnet. In practice, the current-less volume fraction (or available stabilizing volume fraction) of a superconductor bulk magnet applied is typically of the order of 10-30%; note that such a safety margin is also useful to account for (permanently non-superconducting, possibly unknown) defects in the superconductor bulk material.

On the other hand, the inventors found that there is no harm in inducing small currents for correcting field homogeneity in said layer in the superconductor bulk magnet adjacent to the superconductor bore, on the inner wall of the superconductor bulk magnet. Those currents will only eat up a small fraction of the stabilizing volume, generally irrelevant as far as magnet stabilization is concerned, since the inhomogeneity to be compensated for is typically of the order of only a few hundred ppm or less, i.e. much smaller than typical stabilizing volume fraction. For example, if a stabilizing volume fraction of 20% that has no electrical current in the superconductor bulk magnet was applied, and correction currents were required to generate an auxiliary magnetic field of the order of 1000 ppm (as compared to the magnetic field generated by the charger magnet), the corresponding correction currents would require a volume of about 80%*1,000/1,000,000=0.08%. Accordingly, a stabilizing volume fraction of 19.92% would remain, which is just as good as 20% in practice.

The current on the inside (wall of the superconductor bore) of the superconductor bulk magnet can be readily induced by the same process as the currents on the outside, i.e. by field-cooling. In order to be able to induce currents on the inside of the superconductor bulk magnet, an excitation coil has to be placed inside the superconductor bore. The current in the excitation coil, like the current in the charger magnet, needs to be applied before cooling the superconductor bulk magnet through the transition temperature (critical temperature $T_c$) into the operational temperature range (below $T_c$), and has to be ramped down when the superconductor bulk magnet is in the operational temperature range (below $T_c$).

In practice a correction coil system comprising a plurality of coils is placed at least partially, and typically completely, within the superconductor bore, and the auxiliary magnetic field generated by the correction coil system can be set simply by setting one or a plurality of auxiliary electrical currents, i.e. without hardware modifications. Accordingly, the auxiliary magnetic field may easily be adapted to the present needs, in particular adapted to the individual superconductor bulk magnet and other equipment relevant for field homogeneity, such as a cryostat in which the superconductor bulk magnet is arranged, or the charger magnet used. In particular, the auxiliary magnet field or the corresponding auxiliary current or currents may be optimized iteratively, driving the superconductor bulk magnet through appropriate field/temperature cycles.

A step described as following a previous step may follow said previous step immediately, or after one or more other intermediate steps.

Note that turning on and turning off the currents is typically done through ramping the currents, preferably linearly ramping the currents.

The field correction unit is operated electrically, via one or a plurality of auxiliary electrical currents running through the correction coil system. If a plurality of auxiliary electrical currents is applied, each auxiliary current is applied to a particular coil (or correction coil) or subset of coils (correction coils) of the correction coil system. Typically, a particular subset of coils is adapted to compensate for particular field gradient direction and order. Note that typically, only the $B_z$ component (magnetic field component along the axial direction) undergoes a homogenization in the course of the invention.

After step d) and d'), the magnetic field within the superconductor bulk is conserved by the superconductor bulk magnet ("trapped" magnetic field). After having removed the superconductor bulk magnet (together with its cryostat) from the charger magnet (and typically also the field correction unit from the superconductor bore), the superconductor bulk magnet may be transported to a site of application and used in the intended application; note that the superconductor bulk magnet has to be kept well below its critical temperature $T_c$ all the time, and so it is kept in its cryostat and sufficient cooling power is applied. In the course of a typical application, a sample is positioned in the trapped magnetic field (within the sample volume) and undergoes a measurement, such as an NMR measurement. If needed, also an active shim system may be used in the superconductor bore to further homogenize the trapped magnetic field (within the sample volume).

It should be noticed that in step c), the temperature $T_{bulk}$ is lowered significantly below $T_c$ (sometimes also called $T_{crit}$) in order to provide a sufficient superconducting current carrying capacity, such as with $T_{bulk} \leq 2/3 * T_c$ or $T_{bulk} \leq 1/2 * T_c$, preferably with $1/3 * T_c \leq T_{bulk} \leq 2/3 * T_c$.

The superconductor bulk magnet is typically made from a high temperature superconductor, in particular of ReBCO type, or made of a $MgB_2$. Typically, $T_c \geq 30K$, such that the cryostat may be operated dry. A typical superconductor bulk magnet used in the invention is designed to conserve a magnetic field of a strength of between 3 Tesla and 8 Tesla, and often between 4.5 Tesla and 7.5 Tesla, and it has typically a benchtop size (including its cryostat).

In general, the superconductor bulk magnet is of a closed ring shape, made of a single superconductor ring structure or of a plurality of ring-shaped superconductor sub-structures such as discs or coatings on a substrate (such as a sheet metal or a foil); the ring-shaped sub-structures are arranged coaxially and stacked axially and/or radially, and may be combined into a so-called "composite bulk" by structurally connecting the sub-structures. All these variants constitute superconductor bulk magnets, in accordance with the invention. Structures or sub-structures for a superconductor bulk magnet may be grown from a melt; sub-structures to be combined into a "composite bulk" are typically made by coating a substrate. A superconductor bulk magnet, in accordance with the invention, allows a trapping of a magnetic field in its bore, wherein the superconductor bulk magnet in general does not possess any electric current supplies, but instead is designed for inductive charging only.

Preferred Variants of the Invention

A preferred variant the inventive method provides that the method includes at least one preparatory cycle of steps, including at least step b), followed by step c), followed by step d), followed by a step f), followed by a step g), with step f) measuring a magnetic field profile within the superconductor bore of the superconductor bulk magnet, wherein $T_{bulk} < T_c$, and with step g) determining from the magnetic field profile measured in step f) at least one auxiliary electrical current to be applied to the field correction unit in a next cycle of steps, and increasing the temperature $T_{bulk}$ of the superconductor bulk magnet above the critical temperature $T_c$, and that the method comprises a final cycle of steps, including at least step b) and step b'), followed by step c), followed by step d) and step d'), followed by step e), with, in step b') setting the at least one auxiliary current as determined in step g) of the previous preparatory cycle of steps.

So in this variant, after step a) and typically also step a'), one or more preparatory cycles of steps are performed, and then the final cycle of steps is performed. Note that step a), step a') and the steps of the final cycle of steps are described in claim 1 already. In the simplest case, only one preparatory cycle is performed.

The at least one auxiliary current is determined (calculated) in step g) such that the magnet field profile of the superconductor bulk magnet obtained in the next cycle of steps after having turned off the electrical current and the auxiliary electrical current will have a better homogeneity (within the sample volume) than the magnetic field profile measured in the current cycle. Based on a knowledge about the correlation of the auxiliary current or currents and the resulting auxiliary magnetic field (which may be obtained experimentally or by calculation beforehand), the auxiliary current or currents for the next cycle of steps can be found for example by numerical calculation. Typically, the final cycle of steps also contains a step f) for verifying whether the homogeneity of the trapped magnetic field (in the sample volume) is good enough, i.e. whether the inhomogeneity is below a predefined threshold level.

Accordingly, through the iterative cycles of steps, an improved homogeneity of the trapped magnetic field of the superconductor bulk magnet may be achieved.

In the final cycle of steps, step b) and step b') may be performed in any order or simultaneously, and step d) and step d') may be performed in any order or simultaneously.

In a preferred further development of this variant, in at least one preparatory cycle of steps, in particular a first preparatory cycle of steps, no auxiliary electrical current is applied to the field correction unit. When not applying an auxiliary electrical current, the magnetic field resulting from the charger magnet alone can be determined ("virgin plot"). This simplifies the calculation of the at least one auxiliary current for the next cycle (or cycles) of steps.

In another preferred further development, at least one preparatory cycle of steps also includes step b') performed before step c), and also includes step d') performed after step c) and before step f). Then the actual effect of the at least one auxiliary electrical current on the magnetic field the superconductor bulk magnet is exposed to, can be included in the iteration of the at least one auxiliary electrical current, allowing an even better improvement of homogeneity of the trapped magnetic field. In a preparatory cycle of steps, step b) and step b') may be performed in any order or simultaneously, and step d) and step d') may be performed in any order or simultaneously. Steps b') and d') are typically included in a second or later preparatory cycle of steps.

Preferred is also a further development wherein during step f), the magnetic field profile in the superconductor bore of the superconductor bulk magnet is measured with at least one magnetic field sensor which is moved along a central axis of the superconductor bulk magnet and rotated about said central axis. This is a simple way to measure the magnetic field profile of the trapped magnetic field (typically within the sample volume). If only one sensor is used, it is preferably movable in radial direction, too. It is also possible to have a plurality of sensors at different (typically fixed) radial positions. Then the magnetic field profile may be measured even with a higher degree of accuracy.

In a preferred variant of the inventive method, a $B_z$ component of auxiliary magnetic field includes at least one order, preferably at least two orders, of on-axis gradient field contributions. The $B_z$ component is the magnetic field component along the central axis of the superconductor bore. On-axis gradients are gradients obtained by differentiating $B_z$ with respect to z. Typically, above all the first order ($dB_z/dz$) and often also the second order ($d^2B_z/dz^2$) on-axis gradients of the charger magnetic field are by far the strongest gradients, and their compensation allows a huge increase in field homogeneity.

Also preferred is a variant wherein a $B_z$ component of the auxiliary magnetic field comprises off-axis field gradient contributions. The $B_z$ component is the magnetic field component along the central axis of the superconductor bore. Off-axis gradients are gradients obtained by differentiating $B_z$ with respect to x ($dB_z/dx$) and/or y ($dB_z/dy$), with x, y, z forming a Cartesian coordinate system, with z parallel to the central axis. By compensating also off-axis gradients, a very high level of homogeneity may be obtained. Note that also a compensation of mixed contributions (such as XZ or YZ, i.e. $d^2B_z/dxdz$, or $d^2B_z/dydz$) may be done.

In an advantageous variant, the field correction unit is kept at a temperature substantially above the temperature $T_{bulk}$ of the superconductor bulk magnet during the method. Typically, the temperature TFCU of the field correction unit is kept at least 50 K above $T_{bulk}$. Often, $T_{FCU}$ is kept at 200 K or above during the entire method; and in a particularly simple variant, $T_{FCU}$ is kept above 273 K (0° C.) during the entire method. The field correction unit may be placed in the room temperature bore of the cryostat containing the superconductor bulk magnet. This keeps the method simple, and the field correction unit is easy to remove after its use. Moreover, the electrical currents in the field correction unit do not threaten to warm the superconductor bulk magnet.

Further preferred is a variant providing that step e) further includes removing the field correction unit from the superconductor bore of the superconductor bulk magnet, and transporting the magnetized superconductor bulk magnet without the charger magnet and without the field correction unit to a site of application. The field correction unit may be specially designed for applying the auxiliary magnetic field at its own outside to the inside wall of a superconductor bulk cylinder, and after its removal does not hinder the transport or the use of the superconductor bulk magnet during the intended application. At the site of application, for example NMR spectroscopy measurements are done using the magnetic field conserved by the superconductor bulk magnet.

Inventive Apparatus for Magnetizing a Superconductor Bulk Magnet

Also within the scope of the present invention is an apparatus for magnetizing a superconductor bulk magnet, in particular for use in an inventive method as described above, the apparatus comprising an electrical charger magnet for generating a magnetic field, the charger magnet having a charger bore;

a cryostat having a room temperature bore, wherein the cryostat is located at least partially within the charger bore;

a superconductor bulk magnet located within the cryostat, such that the superconductor bulk magnet is located within the charger bore, and such that the room temperature bore of the cryostat is at least partially located within a superconductor bore of the superconductor bulk magnet;

a field correction unit, located outside the cryostat and at least partially within the room temperature bore of the cryostat, with the field correction unit comprising a correction coil system for generating an auxiliary magnetic field, with said correction coil system located at least partially, and preferably completely, within the superconductor bore. With the inventive apparatus, the superconductor bulk magnet may undergo a magnetization (charging) by a field-cooling process, wherein both a magnetic field, generated by the charger magnet and applied from outside the superconductor bulk magnet, as well as an auxiliary magnetic field, generated by the field correction unit and applied from within the superconductor bore, may be used at the same time.

Then it is possible to shape the (overall) trapped magnetic field more purposefully, in particular for obtaining a high homogeneity, such as a homogeneity of 100 ppm or better, in particular 10 ppm or better, in a sample volume SV in the room temperature bore, with the sample volume typically with SV≥1 mm$^3$, and often SV≥2 mm$^3$ or SV≥5 mm$^3$. The cryostat may be equipped with a cooling unit (cryocooler) such as a Gifford-McMahon cooler, a pulse tube cooler, or a Stirling cooler, and is typically of dry type. The charger magnet and the field correction unit generate (above all) a $B_z$ field, i.e. a magnetic field in parallel with the central axis of the superconductor bore and the room temperature bore, which are arranged in coaxially stacked; note that the charger bore is also coaxial with the superconductor bore. The magnetic field trapped by the superconductor bulk magnet after the field-cooling process is also (above all) a $B_z$ field.

In a preferred embodiment of the inventive apparatus, the field correction unit further comprises at least one magnetic field sensor, in particular a Hall sensor or an NMR type sensor. By utilizing the magnet field sensor, the magnetic field profile within the superconductor bore or the room temperature bore, respectively, may be measured in a simple way. Note that alternatively, a magnetic field sensor or sensors separate from the field correction unit may be applied.

Advantageously, a further development of said embodiment provides that one or a plurality of magnetic field sensors of the at least one magnetic field sensor is placed at a radial distance with respect to a central axis of the room temperature bore. This allows measuring the magnetic field profile away from the central axis, in particular in order to scan a circular line or cylinder area about the central axis. Note that it is also possible to place one magnetic field sensor on the central axis, in accordance with the invention.

In an advantageous embodiment, the field correction unit is equipped with a mechanism, in particular a motorized mechanism, for moving the field correction unit along a central axis of the room temperature bore and for rotating the field correction unit about the central axis of the room temperature bore. With this setup, a magnetic field sensor placed at a radial distance from the central axis may be used to scan the magnetic field profile on a cylinder surface. Using a plurality of magnetic field sensors, a cylinder volume may be scanned in good approximation.

In another preferred embodiment, the field correction unit comprises at least one subset of coils for generating an on-axis gradient field contribution of at least first order to a $B_z$ component of the auxiliary magnetic field, in particular wherein the field correction unit comprises at least two subsets of coils for generating on-axis gradient field contributions of at least first and second order to the $B_z$ component of the auxiliary magnetic field. With such a subset or subsets of coils, the main contributions to inhomogeneity of the magnetic field may be compensated.

Preferred is also an embodiment wherein the field correction unit comprises at least one subset of coils for generating an off-axis gradient field contribution to a $B_z$ component of the auxiliary magnetic field. Then the achievable homogeneity of the trapped magnetic field is further improved.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

DETAILED DESCRIPTION

Figure 1:
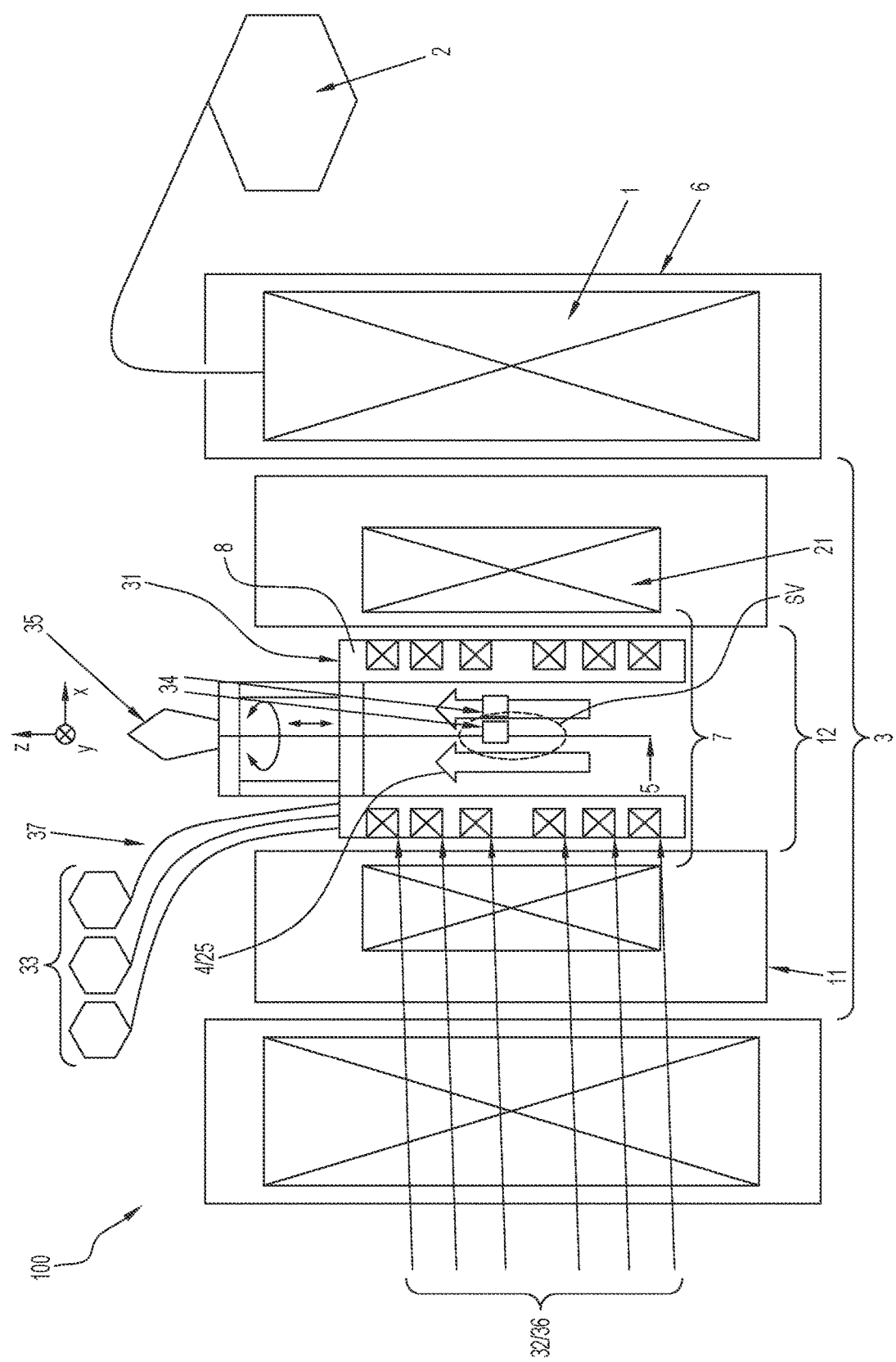
FIG. 1 shows a schematic cross-sectional view of an embodiment of an inventive apparatus for magnetizing a superconducting bulk magnet.

FIG. 1 shows schematically an exemplary embodiment of an inventive apparatus 100 for magnetizing a superconductor bulk magnet 21.

The apparatus 100 comprises an electrical charger magnet 1, here of superconducting type and located in a charger cryostat 6, for generating a magnetic field 4. The charger magnet 1 is basically of cylindrical shape, here with a single solenoid type coil operated with a single electrical current (alternatively the charger magnet may e.g. comprise a plurality of coaxial coils, operated with individual electrical currents). The charger magnet 1 has a charger bore 3 inside of which the largest magnetic field strength of the magnetic field 4 may be achieved. The charger magnet 1 has a charger current source 2 for ramping up and down the electrical current in the charger magnet 1, for changing the magnetic field 4 generated.

Inside the charger bore 3 of the charger magnet 1, a superconductor bulk magnet 21 is arranged. The superconductor bulk magnet 21 is of basically cylindrical closed tube shape, and thus allows circular currents to run through it. The superconductor bulk magnet 21 is arranged in a cryostat 11 (which is independent of the charger cryostat 6), and the inside temperature maintained by the cryostat 11—and thus the temperature $T_{bulk}$ of the superconductor bulk magnet 21—may be altered by increasing and decreasing the cooling power of an attached cryocooler (not shown) and here also an electrical heating device (also not shown). The space radially and axially within the superconductor bulk magnet 21 is called the superconductor bore 7. With the superconductor bulk magnet 21, a magnetic field 25 may be trapped (conserved) within the superconductor bore 7 in a superconducting state of the superconductor bulk magnet 21 (see FIG. 2 for the inventive field-cooling process).

The cryostat 11 exhibits a room temperature bore 12, wherein the room temperature bore 12 runs radially inside the superconductor bore 7.

The charger bore 3, the superconductor bore 7 and the room temperature bore 12 are arranged coaxially, sharing the common central axis 5. Said central axis 5 defines a z-direction, and the magnetic field 4 generated by the charger magnet 1 within the charger bore 4 and in particular within a sample volume SV of the superconductor bulk magnet 21 is basically in parallel with the z-direction, so that the $B_z$ component of the magnetic field 4 is the only field component of relevance.

The apparatus 100 further comprises a field correction unit 31, equipped with a correction coil system 36, in the shown embodiment installed on a cylindrical holder 8. The field correction unit 31 is inserted in the room temperature bore 12 of the cryostat 11. The correction coil system 36 is located at least partially, and in the embodiment shown completely, radially and axially within the superconductor bore 7.

The correction coil system 36 comprises a plurality of correction coils 32 that are operated electrically. For this purpose, the field correction unit 31 is connected to a plurality of field correction current sources 33 by lines 37. With the field correction current sources 33, the field correction unit 31 or its correction coil system 36, respectively, may be provided with auxiliary electrical currents, for generating an auxiliary magnetic field from within the superconductor bore 7.

The field correction unit 31 also comprises here two magnetic field sensors 34, one located on the central axis 5, and one located at a radial distance from the central axis 5. Further, the field correction unit 31 is equipped with a motorized mechanism 35. With the mechanism 35 (also called moving mechanism), the field correction unit 31 (and thus also the magnetic field sensors 34) may be translated along the central axis 5, and rotated about the central axis 5, for scanning the magnetic field 4 of the charger magnet 1 and/or the trapped magnetic field 25 within the superconductor bore 7 or the room temperature bore 12, respectively, in particular within the sample volume SV in which a high homogeneity of a trapped magnetic field is desired. The sample volume SV is typically (and as shown) in a region of an axial and radial center of the superconductor bore 7.

Note that the room temperature bore 12 is shown here with two open ends; in other embodiments, the room temperature bore 12 may have one side open and one side closed. Also note that the central axis 5 is here oriented vertically, but in alternative embodiments, it may be oriented differently, for example horizontally. The charger magnet 1 is here of superconducting type; however in other embodiments, it may be of normally conductive type.

Figure 2:
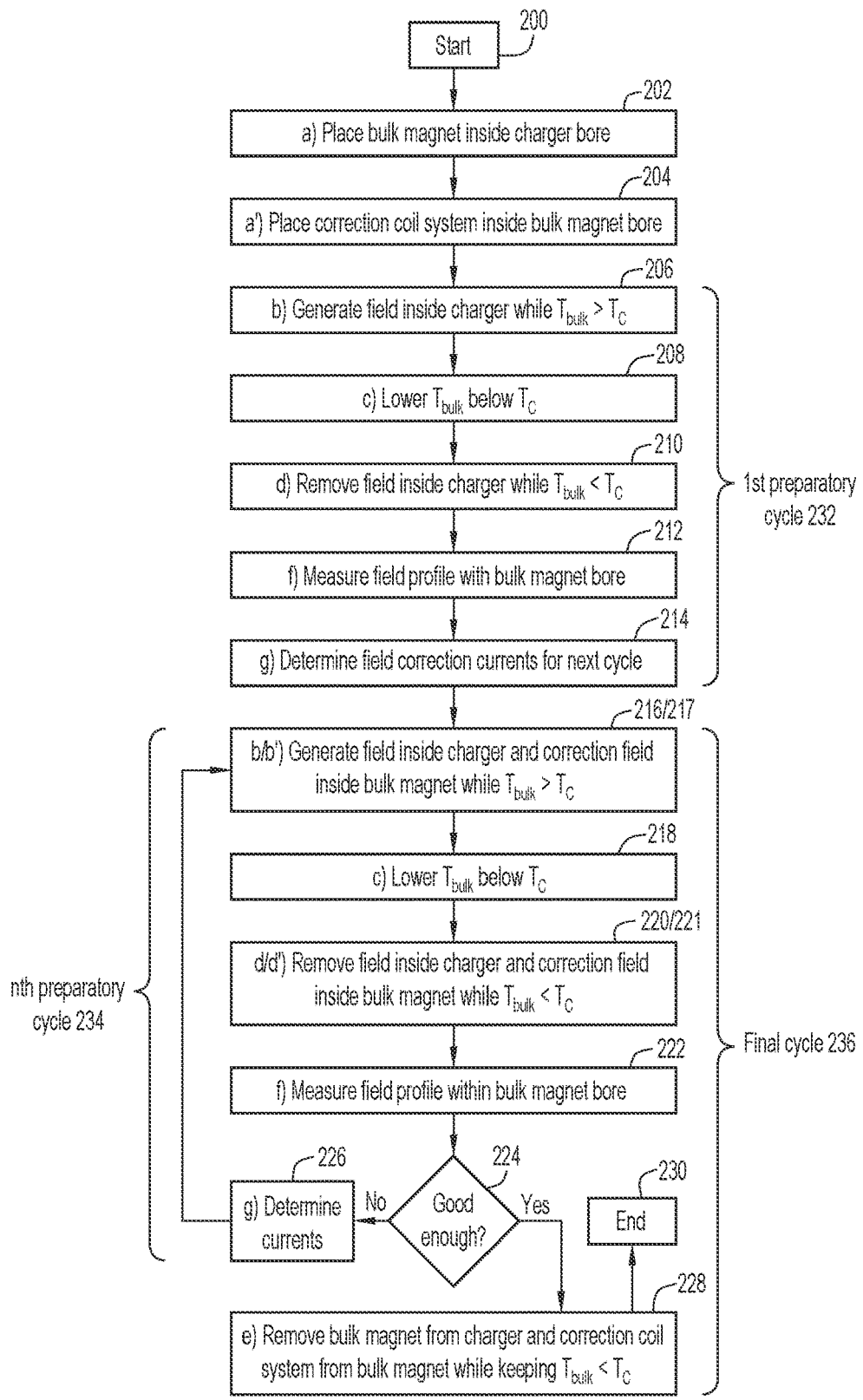
FIG. 2 shows a schematic flow diagram of a variant of the inventive method for magnetizing a superconductor bulk magnet.

FIG. 2 illustrates an inventive method for magnetizing (charging) a superconductor bulk magnet in an exemplary variant. The method may be performed with an apparatus as shown in FIG. 1, for example.

After the start 200 of the method, in an initial step a) 202, the superconductor bulk magnet is placed inside the charger bore of an electrical charger magnet. Note that in general, the charger magnet is stationary, and for example located at a premises of the manufacturer of the superconductor bulk magnet. Further note that in general, the superconductor bulk magnet is held inside a cryostat the inner temperature of which may be controlled.

In the variant shown, in a next step a) 204, a field correction unit or its correction coil system, respectively, is placed within the superconductor bore of the superconductor bulk magnet. In practice, the field correction unit is inserted into the room temperature bore of the cryostat for this purpose. It should be noted that step a') could in principle also take place earlier, i.e. before step a) 202, or later (however before step b)/b') 216, though).

Then the first preparatory cycle of steps 232 takes place, which begins with a step b) 206, wherein the electrical current of the charger magnet is ramped up for generating a magnetic field, with the superconductor bulk magnet being at a temperature $T_{bulk}$ larger than its critical temperature $T_c$. In other words, the superconductor bulk magnet is normally conducting during this step. As a consequence, the magnetic field generated by the charger magnet penetrates the superconductor bulk magnet basically unhindered and fills the superconductor bore. In the first preparatory cycle 232, in the variant illustrated, the field correction unit is not charged.

Then in step c) 208, the temperature inside the cryostat is lowered, such that $T_{bulk}$ becomes lower than $T_c$. In other words, the superconductor bulk magnet is made superconducting.

Now in step d) 210, the electrical current operating the charger magnet is ramped down, so its magnetic field is turned off. However, the superconductor bulk magnet keeps the magnetic flux in its superconductor bore, resulting in a trapped magnetic field inside the superconductor bore. The superconductor bulk magnet is kept with $T_{bulk}<T_c$ to remain superconducting.

In a next step f) 212, with $T_{bulk}<T_c$ still, the magnetic field profile of the trapped magnetic field is measured within the superconductor bore. Accordingly, the characteristics of the trapped magnetic field which results from the charger magnet alone can be determined.

The trapped magnetic field, in particular its inhomogeneity, is now analyzed, and from the result of this analysis, field correction currents (also called auxiliary electrical currents) for running the field correction unit are derived in a step g) 214. With the field correction currents properly chosen (see below), the field correction unit may (in the next cycle) generate an auxiliary magnetic field superposing the magnetic field of the charger bore, and trapping this superposition of fields with the superconductor bulk magnet will result in an improved homogeneity of the trapped magnetic field. In the course of this step g) 214, the superconductor bulk magnet is discharged and brought to a temperature $T_{bulk}>T_c$, so it becomes non-superconducting, as a preparation for the next cycle of steps. Step g) 214 finishes the first preparatory cycle of steps 232.

Then in general, a next preparatory cycle of steps 234 follows. This cycle 234 starts with steps b) 216 and b') 217, i.e. ramping up the current at the charger magnet (step b) again and ramping up auxiliary electrical currents at the field correction unit (step b') as determined in previous step g) 214, which may be done in any order or concurrently, while keeping $T_{bulk}>T_c$. Now the superposition of the magnetic field generated by the charger magnet and the auxiliary magnetic field generated by the field correction unit penetrates the (non-superconducting) superconductor bulk magnet and fills the superconductor bore.

Next, in a step c) 218, the superconductor bulk magnet is cooled down, such that $T_{bulk}$ becomes lower than $T_c$, and the superconductor bulk magnet becomes superconducting.

Subsequently, in steps d) 220 and d') 221, the electrical current of the charger magnet is ramped down (step d) and the auxiliary electrical currents at the field correction unit are ramped down (step d'), while keeping $T_{bulk}<T_c$. In other words, the magnetic field of the charger magnet and the auxiliary magnetic field of the field correction unit are turned off. However, the superconducting superconductor bulk magnet traps the magnetic flux in its inside, and a magnetic field is hence trapped in the superconductor bore again.

In the variant shown, in next step f) 222 the magnetic field profile of the trapped magnetic field inside the superconductor bore is measured.

The measured field is then evaluated 224, i.e. its homogeneity is checked. If the homogeneity does not achieve a predefined limit value, and is thus is not considered good enough for the intended application, a new set of auxiliary electrical currents is derived in a step g) 226, taking into account the measured magnetic field profile obtained in step f) 222 of the present cycle 234 and typically also measured magnetic field profiles measured in possible steps f) of previous cycles, such as step f) 212 of cycle 232. Note that in step g) 226 the superconductor bulk magnet is discharged and brought above $T_c$ again, too. With this new set of auxiliary currents, a next cycle of steps is started at steps b), b') 216, 217; it should be understood that further preparatory cycles 234 may follow to further improve the homogeneity of the trapped magnetic field, as desired or required.

However, if the homogeneity of the measured trapped magnetic field does achieve (or exceed) the predefined field homogeneity level in evaluation 224, and is thus considered good enough for the intended application, in a step e) 228, the field correction unit is removed from the superconductor bore (i.e. is pulled out of the room temperature bore of the cryostat enclosing the superconductor bulk magnet), and the superconductor bulk magnet (together with its cryostat) is removed from the charger bore of the charger magnet. The temperature of the superconductor bulk magnet $T_{bulk}$ is kept well below $T_c$ in order to maintain the superconductivity and thus to maintain the trapped magnetic field in the superconductor bore. The method then ends 230, and the most recent steps b), b') 216, 217, and c) 218, and d), d') 220, 221, and f) 222, and e) 228 of the present cycle then belong to the final cycle of steps 236 (and not to a preparatory cycle of steps). Note that it is well possible that the first preparatory cycle 232 is directly followed by the final cycle of steps 236, in accordance with the invention.

After the magnetization of the superconductor bulk magnet has ended 230, the charged superconductor bulk magnet is typically transported to a site of application such as a laboratory, where the trapped magnetic field is needed and used for experiments, such as NMR investigations of samples wherein the samples are exposed to the trapped magnetic field in the sample volume. As long as the superconductor bulk magnet is kept at a temperature $T_{bulk}$ far enough below the critical temperature $T_c$ of the superconductor material of the superconductor bulk magnet, the magnetic field within the superconductor bore will be conserved without need for recharging.

Figure 3:
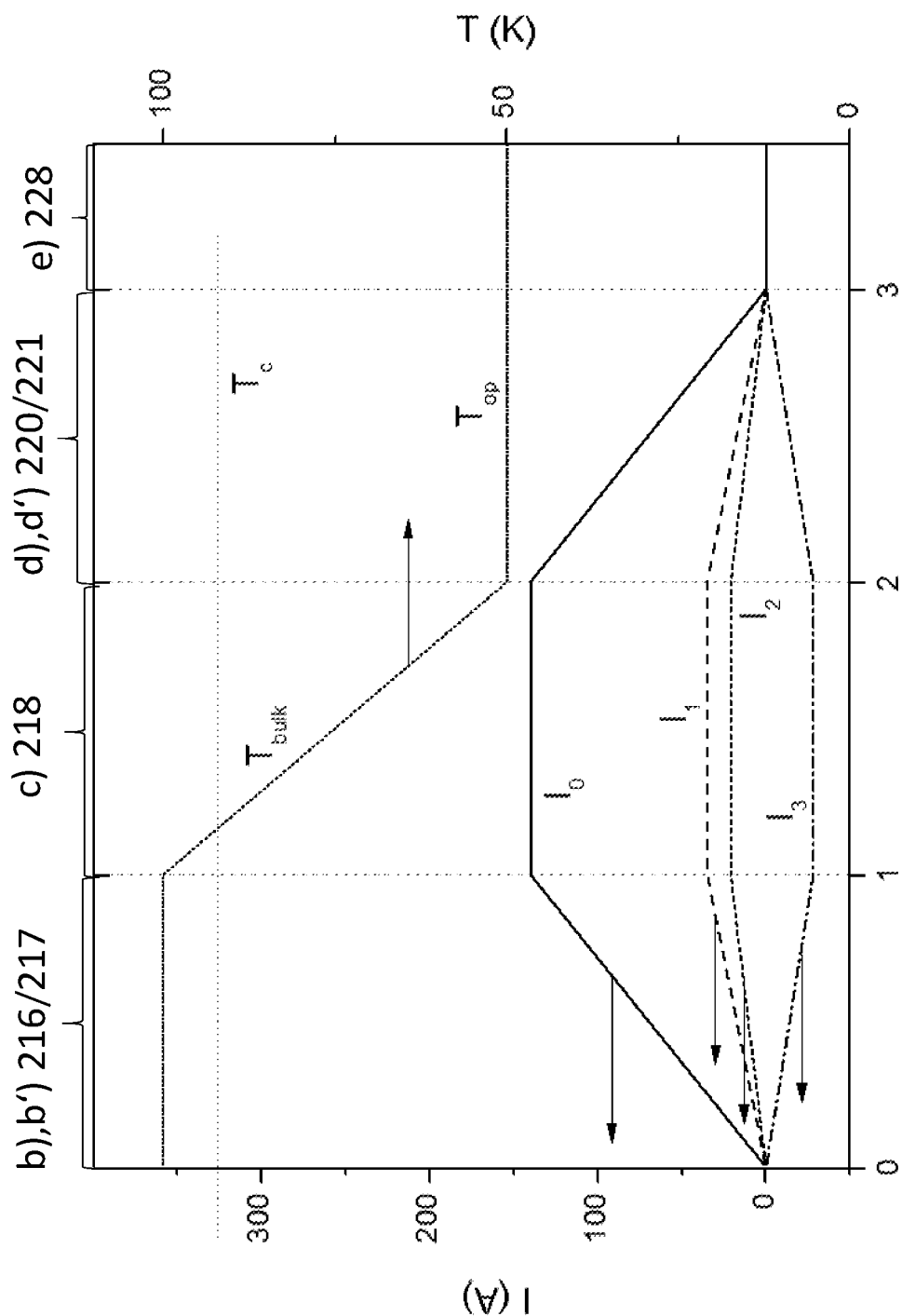
FIG. 3 shows a schematic diagram of the ramping of currents at the charger magnet and at the field correction unit and of the temperature of the superconductor bulk magnet during the inventive method.

FIG. 3 illustrates the course of the method as described in FIG. 2 during the nth (i.e. not the first) preparatory cycle or the final cycle of steps. Illustrated is the temperature $T_{bulk}$ of the superconductor bulk magnet (top curve, with the scale of temperature T on the right hand side in Kelvin, compare arrow to the right), as well as the electrical current $I_0$ applied to the charger magnet and the auxiliary electrical currents $I_1$, $I_2$, $I_3$ applied to the field correction unit or the correction coil system, respectively, located inside the superconductor bore (bottom curves, with the scale of current I to the left hand side in Amperes, compare arrows to the left), as a function of time t (in arbitrary units). Typically, each auxiliary electrical current $I_1$, $I_2$, $I_3$ is applied to a separate subset of coils of the correction coil system, with each subset of coils addressing a gradient field contribution of a particular order to the $B_z$ component of the auxiliary magnetic field; alternatively, auxiliary electrical currents may simply be assigned to single correction coils directly.

During steps b), b') 216, 217, $T_{bulk}$ is above the critical temperature $T_c$ (which is here at about 90K). The current $I_0$ as well as the auxiliary currents $I_1$, $I_2$, $I_3$ are ramped up from zero to a respective desired current (note that 13 here has a negative sign). Note that the absolute values of the attained auxiliary currents $I_1$, $I_2$, $I_3$ are much lower than the absolute value of current $I_0$. In the variant shown, the currents $I_0$ and $I_1$, $I_2$, $I_3$ are ramped up simultaneously, however alternatively, it is also possible to apply a desired sequence, for example with ramping up $I_0$ first, and $I_1$, $I_2$, $I_3$ afterwards. Through the currents $I_0$, $I_1$, $I_2$, $I_3$, a magnetic field is generated from outside and auxiliary magnetic field is generated from inside the superconductor bulk magnet.

When the current $I_0$ and the auxiliary currents $I_1$, $I_2$, $I_3$ have reached their desired (maximum) value, step c) 218 may begin. With the currents $I_0$, $I_1$, $I_2$, $I_3$ kept constant, $T_{bulk}$ is lowered to an operating temperature $T_{op}$, which is below $T_c$, with $T_{op}$ of about 50 K here. So during step c) 218, the superconductor bulk magnet becomes superconducting, and is thus prepared to take over an electrical current by induction.

Then in steps d), d' 220, 221, with $T_{bulk}$ being kept at $T_{op}$, the current $I_0$ and the auxiliary electrical currents $I_1$, $I_2$, $I_3$ are ramped down (returned) to zero. As a result of the time-varying magnetic field, electrical currents are induced in the superconductor bulk magnet, resulting in the magnetic field inside the superconductor being essentially constant over time. The magnetic field is said to be trapped in the bulk magnet.

In step e) 228, which basically indicates the final stage of the superconductor bulk magnet after its magnetization (charging), all currents $I_0$, $I_1$, $I_2$, $I_3$ have been turned off, and $T_{bulk}$ is kept at $T_{op}$. The superconductor bulk magnet (together with its cryostat) can be removed from the charger magnet bore, and the field correction unit may be removed from the superconductor bore now.

Figure 4:
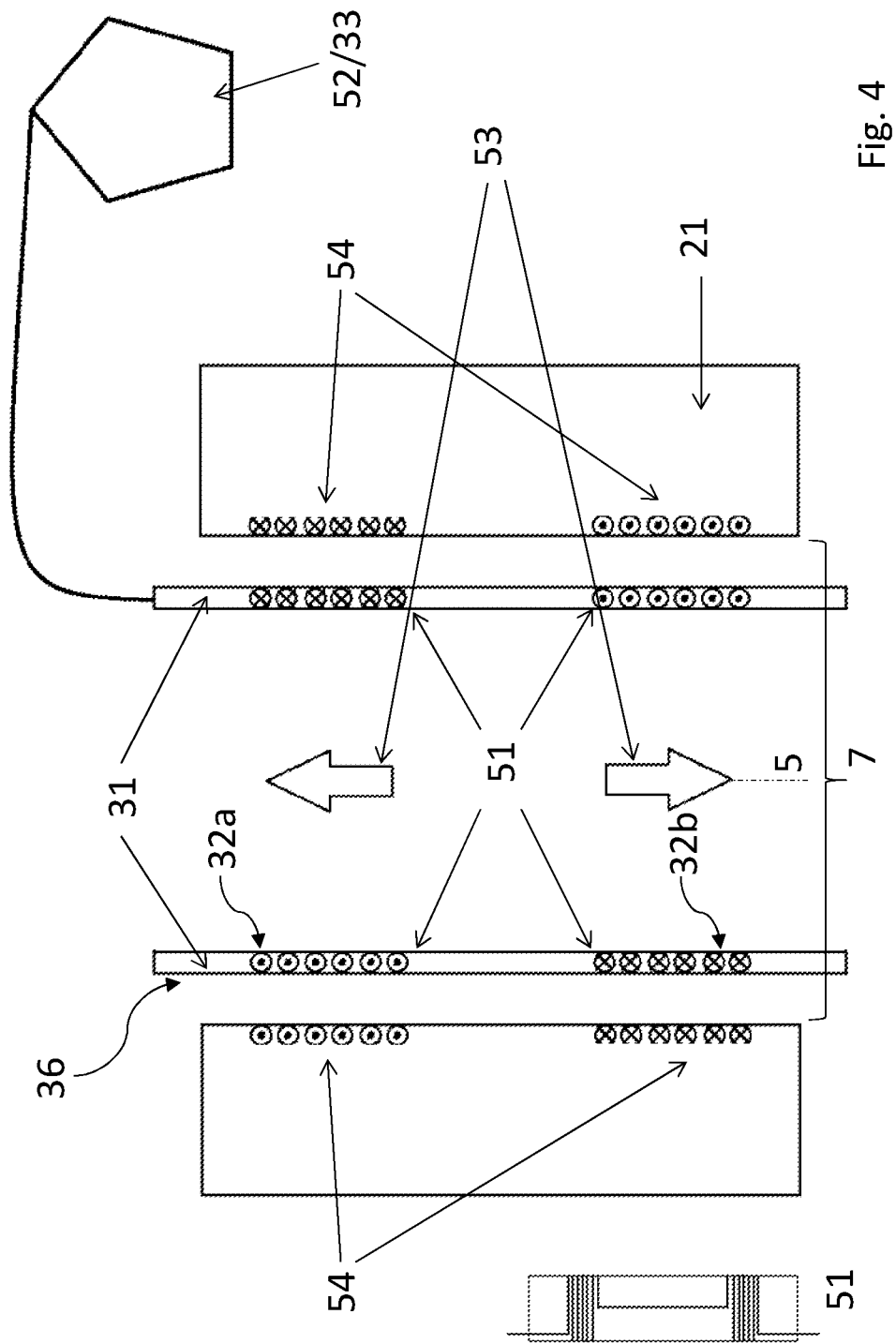
FIG. 4 illustrates in a schematic cross-section the inductive take-over of electrical currents during the inventive method at the superconductor bore, for a first order on-axis gradient contribution.

FIG. 4 illustrates in a schematic cross-section of a part of a correction coil system 36 of a field correction unit 31, namely a subset of coils 51 (see also inset left) of here two correction coils 32a, 32b. Said correction coils 32a, 32b of the subset of coils 51 are here of solenoid type and are arranged coaxially with the central axis 5 of the superconductor bore 7 of the superconductor bulk magnet 21. They are electrically connected in series wherein the direction of an auxiliary electrical current provided by field correction current source 33/53 is opposite in the two correction coils 32a, 32b, compare the dots and crosses in the cross-section of the coil windings. As a result, an auxiliary magnetic field 53 generated by the subset of coils 51 has opposite directions in an upper part and a lower part of the superconductor bore 7, and is basically parallel to the central axis 5. Accordingly, the auxiliary magnetic field 53 generated by the subset of coils 51 represents a first order on-axis gradient field contribution to the z component of the (total) magnetic field $B_z$ in the superconductor bore 7. For this reason, the auxiliary magnetic field 53 generated here is also called the linear on-axis correction field.

When turning off the auxiliary electrical current, with the superconductor bulk magnet 21 being superconducting, the currents in the coils 32a, 32b are transferred to the nearby inner layer of the superconductor bulk magnet 21 by induction, compare trapped currents 54. These trapped currents 54 basically maintain the corresponding magnetic field in the superconductor bore 7, i.e. the auxiliary magnetic field 53 is basically conserved.

Figure 5:
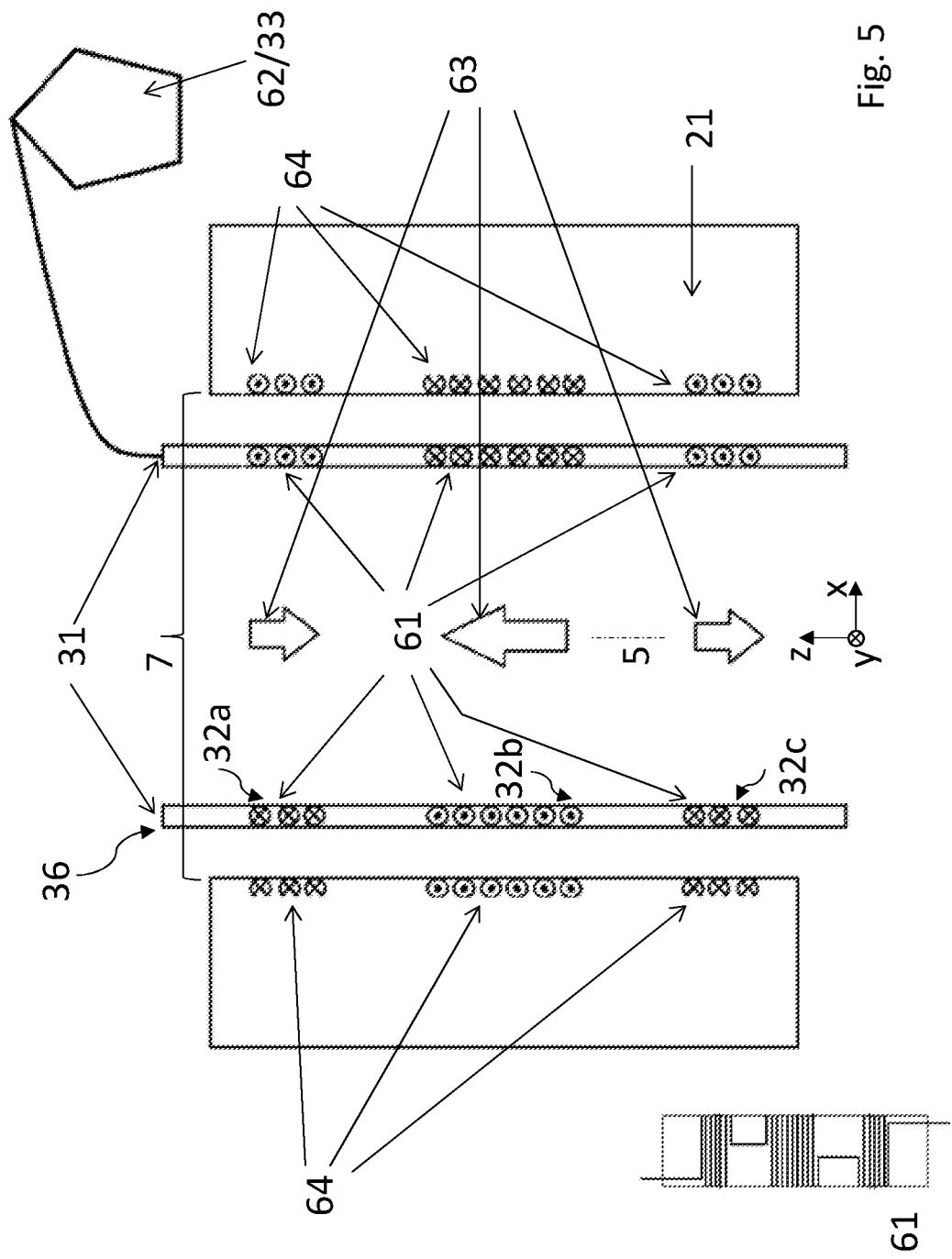
FIG. 5 illustrates in a schematic cross-section the inductive take-over of electrical currents during the inventive method at the superconductor bore, for a second order on-axis gradient contribution.

FIG. 5 illustrates in a schematic cross-section of a further part of a correction coil system 36 of a field correction unit 31, namely a subset of coils 61 (see also inset left) of here three correction coils 32a, 32b, 32c. Said correction coils 32a, 32b, 32c of the subset of coils 61 are again here of solenoid type and are arranged coaxially with the central axis 5 of the superconductor bore 7 of the superconductor bulk magnet 21. They are electrically connected in series wherein the direction of an auxiliary electrical current provided by field correction current source 33/62 alternates in the three correction coils 32a, 32b, 32c along the central axis 5, compare the dots and crosses in the cross-section of the coil windings. As a result, an auxiliary magnetic field 63 generated by the subset of coils 61 has a first direction in an upper part and a lower part of the superconductor bore 7, and has an opposite second direction in a center part of the superconductor bore 7, and is basically parallel to the central axis 5. Accordingly, the auxiliary magnetic field 63 generated by the subset of coils 61 represents a second order on-axis gradient field contribution to the z component of the (total) magnetic field $B_z$ in the superconductor bore 7. For this reason, the auxiliary magnetic field 63 generated here is also called the quadratic on-axis correction field.

When turning off the auxiliary electrical current, with the superconductor bulk magnet 21 being superconducting, the currents in the coils 32a-32c are transferred to the nearby inner layer of the superconductor bulk magnet 21 by induction, compare trapped currents 64. These trapped currents 64 basically maintain the corresponding magnetic field in the superconductor bore 7, i.e. the auxiliary magnetic field 63 is basically conserved.

Figure 6:
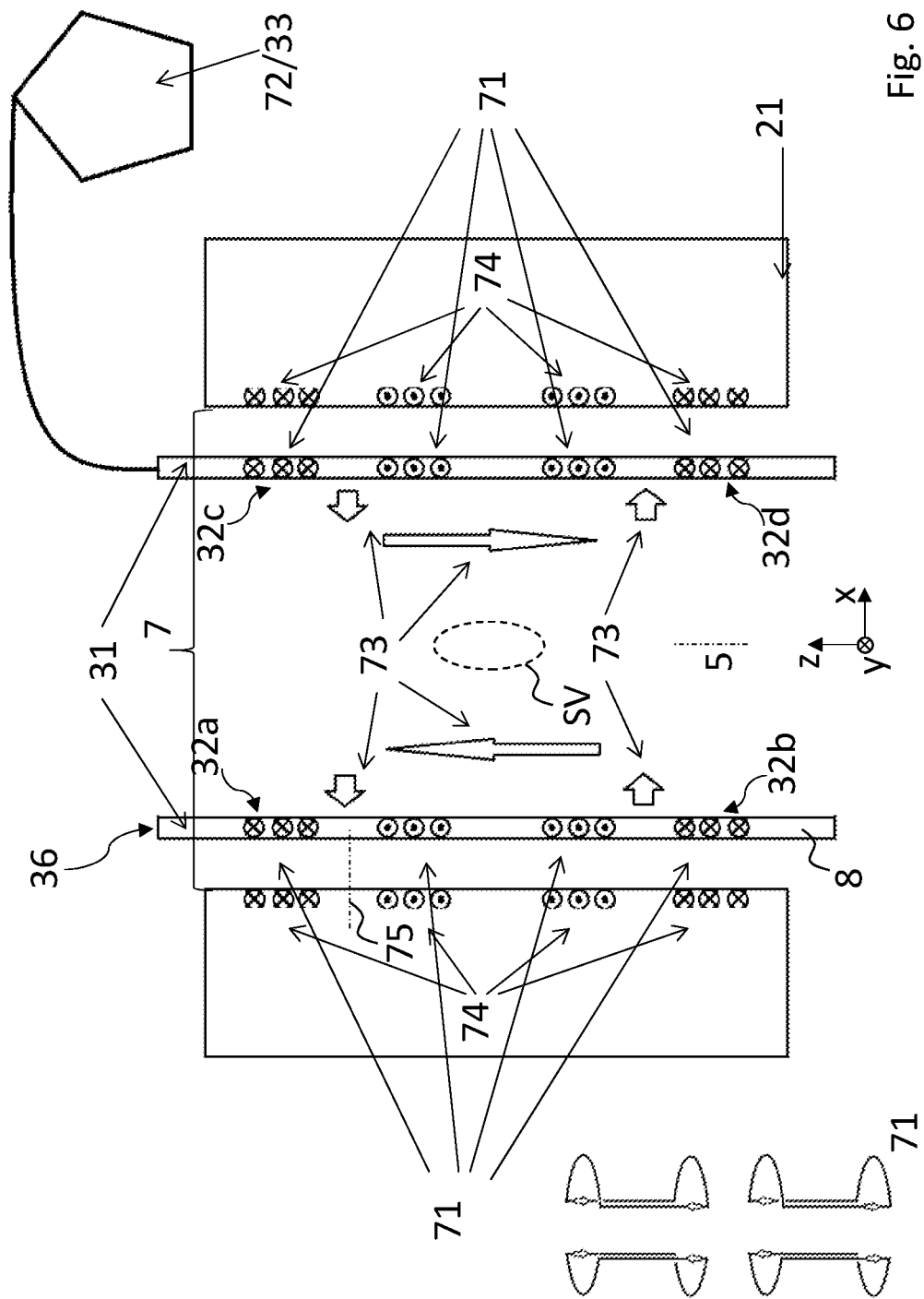
FIG. 6 illustrates in a schematic cross-section the inductive take-over of electrical currents during the inventive method at the superconductor bore, for a first order off-axis gradient contribution.

FIG. 6 illustrates in a schematic cross-section of another further part of a correction coil system 36 of a field correction unit 31, namely a subset of coils 71 (see also inset left) of here four correction coils 32a, 32b, 32c, 32d. Said correction coils 32a-32d of the subset of coils 71 are here of saddle type and arranged on the cylindrical holder 8 of the field correction unit 31, with their local saddle coil window axes 75 perpendicular to the central axis 5 of the superconductor bore 7 of the superconductor bulk magnet 21. They are electrically connected in series wherein an auxiliary electrical current provided by field correction current source 33/72 has a first direction for the two upper coils 32a, 32c, and has a second direction opposite to the first direction in the two lower coils 32b, 32d, compare the dots and crosses in the cross-section of the coil windings. As a result, an auxiliary magnetic field 73 generated by the subset of coils 71 has a first direction in a left central part of the superconductor bore 7, and has an opposite second direction in a right central part of the superconductor bore 7, and is basically in parallel to the central axis 5. Accordingly, the auxiliary magnetic field 63 generated by the subset of coils 61 represents a first order off-axis gradient field contribution to the z component of the (total) magnetic field $B_z$ in the superconductor bore 7. For this reason, the auxiliary magnetic field 73 generated here is also called the linear off-axis correction field. Note that there are also some contributions $B_x$ to the auxiliary magnetic field 73 on radially and axially off-center regions, not relevant for the typically used central volume fraction or sample volume SV of the superconductor bore 7.

When turning off the auxiliary electrical current, with the superconductor bulk magnet 21 being superconducting, the currents in the coils 32a-32d are transferred to the nearby inner layer of the superconductor bulk magnet 21 by induction, compare trapped currents 74. These trapped currents 74 basically maintain the corresponding magnetic field in the superconductor bore 7, i.e. the auxiliary magnetic field 73 is trapped.

It should be noted that in an inventive apparatus as described in FIG. 1, the correction coil system 36 may comprise one or a plurality of subsets of coils 51, 61, 71 as shown in FIGS. 4 through 6, and each subset of coils is operated with a separate field correction current source 33 resp. 52, 62, 72.

Figure 7:
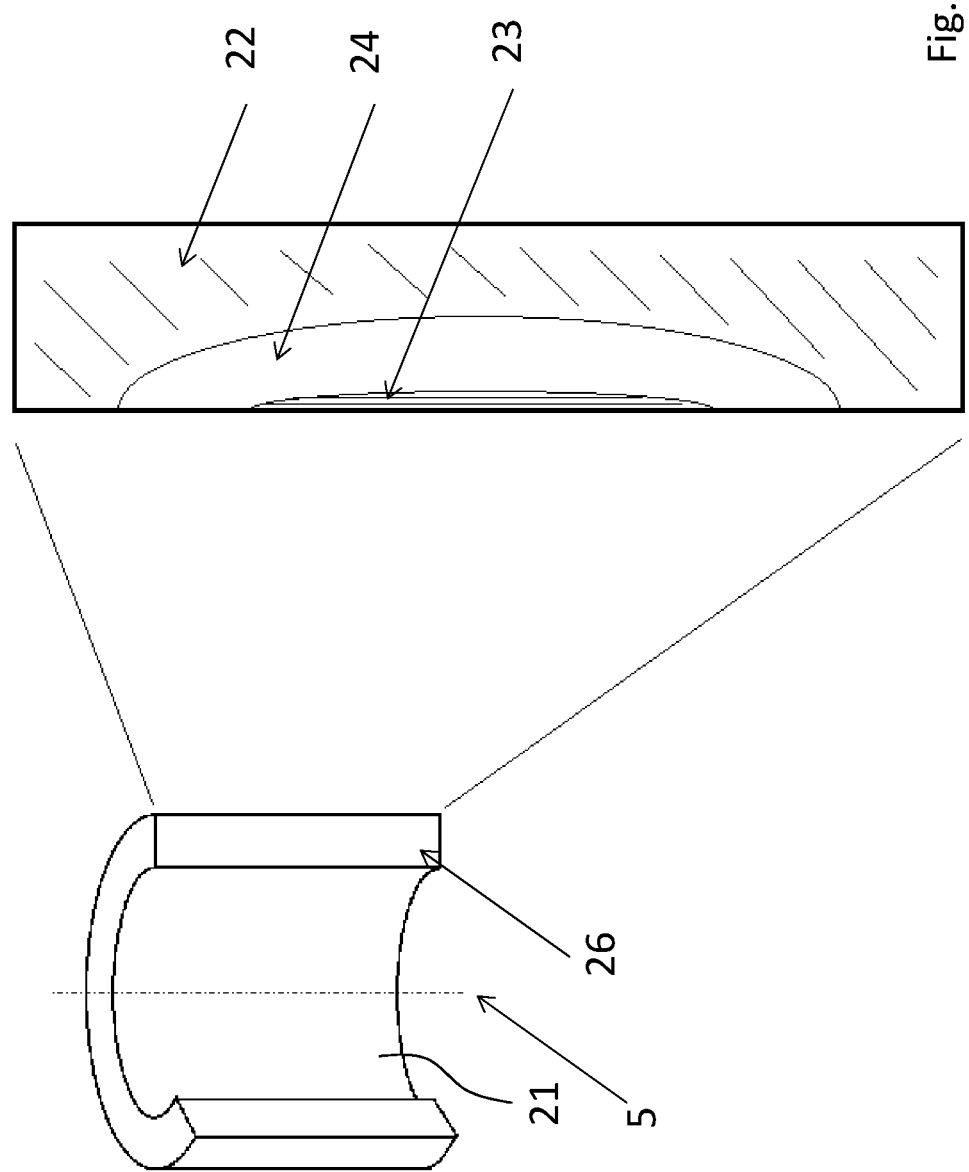
FIG. 7 shows in a schematic cross-section the penetration of a superconductor bulk magnet with induced currents radially from the outside and the inside, in accordance with the invention.

FIG. 7 illustrates in a schematic view of a cross-section (or cut face 26) of a superconductor bulk magnet 21, taken along a plane including the central axis 5, and magnetized in accordance with the invention.

After the inventive field-cooling process, a radially (and to some extend axially) outer part of the superconductor bulk magnet 21 (typically having a volume fraction of 75% or more of the of the superconductor bulk magnet 21) is magnetized by a trapped field current 22, corresponding basically to (or originating from) an electrical current originally present in the charger magnet. Further, a radially (and to some extent axially) inner part of the superconductor bulk magnet 21 (typically having a volume fraction of 1% or less of the of the superconductor bulk magnet 21) is magnetized by a trapped correction field current 32, corresponding basically to (or originating from) the auxiliary electrical currents originally present in the field correction unit or its correction coil system. In between, a current-free region 24 (typically having a volume fraction of between 10% and 30% of the superconductor bulk magnet 21) remains inside the superconductor bulk magnet 21.

It should be mentioned that in order to maintain a sufficiently large current-free region 24, the electrical current in the charger magnet in step b) has to be set appropriately, and in particular low enough so that the volume of the trapped field current 22 does not go beyond the desired volume fraction in step d). If the volume of the superconductor bulk magnet was completely filled with trapped field current 22, the superconductor bulk magnet would quench, which bears a big risk of permanently damaging the superconductor bulk magnet.

In the following, the determination of the auxiliary electric currents (also called correction currents) for operating field correction unit or its correction coil system (in the course of a step g), see above) is explained in more detail.
Determination of the Correction Currents (First Run/Cycle of Steps)

The determination of the set of correction currents for the correction coils is based on the assumption of the validity of the superposition principle for trapped currents, i.e. that the sum of the trapped currents for two successive applications of field-cooling with applied external fields equals the trapped current observed from field-cooling an external field of the sum of the two fields.

Under this assumption, which is justified below, a measured field profile can be developed along the z-axis ("on-axis") into a Taylor expansion for $B_z(z)$, i.e.

$$B_z(z) = \Sigma_{i=0}^{N} B_z^i(z), \text{with}$$

$$B_z^i(z) = \alpha_i z^i, \text{ and } N = \infty$$

In this example, $B_z^0(z)$ corresponds to the (constant, homogeneous) background field, $\alpha_1$ is the linear on-axis gradient coefficient (compare FIG. 4), and $\alpha_2$ is the coefficient for the quadratic term (compare FIG. 5).

The correction coil system can, as an example, be implemented in a way so that the currents $I_1, I_2, \ldots$ generate a magnetic field that leads to a trapped field after field-cooling, that has the field profile of a linear, quadratic, . . . field-z dependence. In this (simple) case, the coefficients $\alpha_i$ are directly proportional to the correction currents in a respective subset of coils i.

The implementation of a correction coil system that leads to exact monomial field-z dependences around the magnetic center might be cumbersome, and other basis functions than monomials might be more practical and/or efficient. In order for the field decomposition to work, it is only necessary for the basis functions to be linearly independent, and to form a complete basis set, so that any measured field profile can be written as a uniquely defined linear combination of the basis functions.

Strictly speaking, this decomposition only works perfectly if we have an infinite number of basis functions, which form a basis for the underlying set of possible field profiles. In practice, there will be a finite number of subsets of coils in the correction coil system, operated by a finite number of correction current sources. In this case, N is finite in the above expansion, and the measured field profile is not equal exactly to, but only approximated by, the expansion. However, in all practical cases, the expansion converges very quickly around z=0 (i.e. around the magnetic center), and the field profile is sufficiently close to being homogeneous after correction of a few leading orders. A practical number for N could be between 2 and 4.

Beyond correcting these "gradients" along the magnetic axis, there are typically also field variations "off the axis". A typical example (and a leading order in the three-dimensional expansion) would be the gradient $dB_z/dx$. The $B_z$ component at z=0 varies when moving away from the axis r=0 in the x-(or y-)direction.

Again, this can be expressed in terms of a coefficient, which is a measure of how much the field $B_z$ changes when moving radially outwards 1, 2, 3 etc. mm). Again, we can define a subset of coils that creates such an "off-axis gradient", the so-called X-gradient, and that is operated in the same manner as the on-axis gradients described above, compare also FIG. 6. Note that also higher order (quadratic, . . . ) off-axis gradients exist, and can be addressed accordingly.

Mixed order terms must be mentioned here for completeness. They are in principle possible to be corrected using the described method, too, but this may seem to be unpractical.

Pragmatically, the determination of the currents can be accomplished following this procedure:

1. Determine the trapped field profile for a given superconductor bulk magnet geometry and target temperature, of any of the installed (and independently operable) coils or subsets of coils and the respective gradient efficiency, i.e. a factor indicating the magnetic field strength per correction current amplitude.
2. Determine the trapped field profile for the individual bulk magnet without applying correction fields (virgin plot).
3. Numerically determine the best combination of currents $I_i$ to minimize the inhomogeneity of the sum of the virgin plot, and a weighted sum of the gradient profiles $g_i(R)$. Best combination in this context means the lowest absolute difference anywhere in the volume under consideration (the "sample volume", SV). Accordingly, the expression $$\max\left\{\text{abs}\left[B_z^{virgin}(R) - \sum_{i=0}^{n} g_i(R) * I_i\right] : R \in SV\right\}$$

shall be minimized.

Determination of the Correction Currents (Iteration)

When a first set of correction currents has been applied to the system upon a first iteration (run/cycle) of the field-cooling process, and the observed field profile still shows too large a deviation from the B=const field profile, one may reiterate the field-cooling loop with an adjusted set of correction currents. Following the above procedure for expanding the residual inhomogeneous field after the last iteration will provide a new set of correction currents. These have to be added to the last set of currents for the successive field-cooling run rather than replacing them.

Validity of the Assumption of the Applicability of the Superposition Principle

The superposition principle is not applicable, strictly speaking. It assumes that the same region adjacent to the inner wall of the bulk conductor can be simultaneously used to carry current from the individual correction coils. As field-cooling is by default a process that leads to saturated current densities in a given conductor volume, there is no current carrying "budget" left for the "superposing" step.

Nevertheless, the layer of superconductor that is involved in carrying current from field-cooling the comparatively small fields from the correction coils (as compared to the large currents on the outside of the bulk from the charger magnet) is very thin, of the order of microns. The successive step will then just use the "next available" superconductor layer, located a few microns outside the innermost layer. As this distance is very small compared to the overall size of the bulk magnet, the two currents flow in places that are to a high precision identical to the originally assumed "superposed" locations. The effect on the trapped field is virtually indistinguishable.

The superposition principle, although not strictly fulfilled, is therefore a very good approximation for sufficiently low correction currents.

CONCLUSION

In summary, the invention relates to a method for magnetizing a superconductor bulk magnet (21), with the following steps:

step a) (202) placing the superconductor bulk magnet (21) inside a charger bore (3) of an electrical charger magnet (1), and step a') (204) placing a field correction unit (31) at least partially inside a superconductor bore (7) of the superconductor bulk magnet (21); followed by step b) (206, 216) applying at least one electrical current ($I_0$) to the charger magnet (1), thus generating with the charger magnet (1) a magnetic field (4) which is applied to the superconductor bulk magnet (21) from the outside, wherein a temperature $T_{bulk}$ of the superconductor bulk magnet (21) is above a critical temperature $T_c$ of the superconductor bulk magnet (21), and step b') (217) applying at least one auxiliary electrical current ($I_1$, $I_2$, $I_3$) to the field correction unit (31), thus generating an auxiliary magnetic field (53; 63; 73) which is applied to the superconductor bulk magnet (21) from within the superconductor bore (7), wherein $T_{bulk} > T_c$; followed by step c) (208, 218) lowering $T_{bulk}$ below $T_c$; followed by step d) (210, 220) turning off the at least one electrical current ($I_0$) at the charger magnet (21), wherein $T_{bulk} < T_c$, and step d') (221) turning off the at least one auxiliary electrical current ($I_1$, $I_2$, $I_3$) at the field correction unit (31), wherein $T_{bulk} < T_c$; followed by step e) (228) removing the superconductor bulk magnet (21) from the charger bore (3) and keeping $T_{bulk} < T_c$. The invention provides a method of magnetizing a superconducting bulk magnet, with which a higher homogeneity of the trapped magnetic field of the superconducting bulk magnet can be obtained in a simple way.

LIST OF REFERENCE SIGNS 1 electrical charger magnet
2 charger current source
3 charger bore
4 charger magnetic field
5 central axis
6 charger cryostat
7 bulk magnet superconductor bore
8 cylindrical holder
11 cryostat of the superconductor bulk magnet
12 cryostat bore/room temperature bore
21 superconductor bulk magnet
22 trapped field current (region)
23 trapped field correction current (region)
24 current-free region inside superconductor bulk magnet
25 trapped magnetic field
26 cut face
31 field correction unit
32, 32a-32d correction coil
33 field correction current source(s)
34 magnetic field sensor(s)
35 moving mechanism
36 correction coil system
37 lines
51 linear on-axis correction coil system/subset of coils
52 linear on-axis correction current source
53 linear on-axis correction field/auxiliary magnetic field
54 linear on-axis trapped current
61 quadratic on-axis correction coil system/subset of coils
62 quadratic on-axis correction current source
63 quadratic on-axis correction field/auxiliary magnetic field
64 quadratic on-axis trapped current
71 linear off-axis correction coil system/subset of coils
72 linear off-axis correction coil system current source
73 linear off-axis correction field/auxiliary magnetic field
74 linear off-axis trapped current
75 local axis of correction coil
100 apparatus
200 start
202 step a)
204 step a')
206 step b)
208 step c)
210 step d)
212 step f)
214 step g)
216 step b)
217 step b')
218 step c)
220 step d)
221 step d')
222 step f)

224 evaluation of measured field profile/homogeneity good enough?
226 step g)
228 step e)
230 end
232 1st preparatory cycle of steps
234 nth preparatory cycle of steps
236 final cycle of steps
$I_0$ electrical current of charger magnet
$I_1$-$I_3$ auxiliary electrical current of field correction unit
SV sample volume
t time
$T_{bulk}$ temperature of the superconductor bulk magnet
$T_c$ critical temperature
$T_{op}$ operating temperature of the superconductor bulk magnet

What is claimed is:

1. A method for magnetizing a superconductor bulk magnet, comprising:
   step a) placing the superconductor bulk magnet inside a charger bore of an electrical charger magnet; followed by
   step b) applying at least one electrical current ($I_0$) to the charger magnet, thereby generating with the charger magnet an externally applied magnetic field, wherein a temperature $T_{bulk}$ of the superconductor bulk magnet is above a critical temperature $T_c$ of the superconductor bulk magnet; followed by
   step c) lowering the temperature $T_{bulk}$ of the superconductor bulk magnet below the critical temperature $T_c$ of the superconductor bulk magnet; followed by
   step d) turning off the at least one electrical current ($I_0$) at the charger magnet when $T_{bulk}<T_c$; followed by
   step e) removing the superconductor bulk magnet from the charger bore and keeping $T_{bulk}<T_c$;
   wherein the method further comprises:
   step a') placing a field correction unit at least partially inside a superconductor bore of the superconductor bulk magnet, such that a correction coil system of the field correction unit is located at least partially within the superconductor bore; and
   step b') applying at least one auxiliary electrical current ($I_1$, $I_2$, $I_3$) to the field correction unit, thus generating with the field correction unit an auxiliary magnetic field which is applied to the superconductor bulk magnet from within the superconductor bore, wherein $T_{bulk}>T_c$;
   wherein step a') is performed before step b') and step b') is performed before step c); and
   step d') turning off the at least one auxiliary electrical current ($I_1$, $I_2$, $I_3$) at the field correction unit, wherein $T_{bulk}<T_c$;
   wherein step d') is performed after step c).

2. A method according to claim 1, further comprising:
   at least one preparatory cycle of steps, including at least the step b), followed by the step c), followed by the step d), followed by a step f), followed by a step g),
   wherein the step f) comprises measuring a magnetic field profile within the superconductor bore of the superconductor bulk magnet, wherein $T_{bulk}<T_c$, and
   wherein the step g) comprises determining from the magnetic field profile measured in the step f) at least one auxiliary electrical current ($I_1$, $I_2$, $I_3$) to be applied to the field correction unit in a next cycle of steps, and increasing the temperature $T_{bulk}$ of the superconductor bulk magnet above the critical temperature $T_c$;
   and a final cycle of steps, including at least the step b) and the step b'), followed by the step c), followed by the step d) and the step d'), followed by the step e),
   wherein, in the step b'), the at least one auxiliary current ($I_1$, $I_2$, $I_3$) as determined in step g) of the previous preparatory cycle of steps, is set.

3. A method according to claim 2, wherein, in at least one preparatory cycle of steps, no auxiliary electrical current ($I_1$, $I_2$, $I_3$) is applied to the field correction unit.

4. A method according to claim 3, wherein the at least one preparatory cycle of steps in which no auxiliary current ($I_1$, $I_2$, $I_3$) is applied, includes the first preparatory cycle of steps.

5. A method according to claim 2, wherein at least one preparatory cycle of steps further includes the step b') performed before the step c), and also includes the step d') performed after the step c) and before the step f).

6. A method according to claim 2, wherein, during the step f), the magnetic field profile in the superconductor bore of the superconductor bulk magnet is measured with at least one magnetic field sensor which is moved along a central axis of the superconductor bulk magnet and is rotated about the central axis.

7. A method according to claim 1, wherein a $B_z$ component of the auxiliary magnetic field includes at least one order of on-axis gradient field contributions.

8. A method according to claim 1, wherein a $B_z$ component of the auxiliary magnetic field comprises off-axis gradient field contributions.

9. A method according to claim 1, further comprising maintaining the field correction unit at a temperature that is substantially above the temperature $T_{bulk}$ of the superconducting bulk magnet.

10. A method according to claim 1, wherein the step e) further comprises removing the field correction unit from the superconductor bore of the superconductor bulk magnet, and transporting the magnetized superconductor bulk magnet without the charger magnet and without the field correction unit to a site of application.

11. An apparatus configured to operate according to the method of claim 1.

12. An apparatus for magnetizing a superconductor bulk magnet, comprising:
   an electrical charger magnet configured to generate a magnetic field and comprising a charger bore;
   a cryostat comprising a room temperature bore and located at least partially within the charger bore;
   a superconductor bulk magnet located within the cryostat and located within the charger bore, wherein the room temperature bore of the cryostat is at least partially located within a superconductor bore of the superconductor bulk magnet; and
   a field correction unit located outside the cryostat and at least partially within the room temperature bore of the cryostat, wherein the field correction unit comprises a correction coil system configured to generate an auxiliary magnetic field and located at least partially within the superconductor bore,
   wherein the field correction unit is equipped with a mechanism configured to move the field correction unit along a central axis of the room temperature bore and to rotate the field correction unit about the central axis of the room temperature bore.

13. An apparatus according to claim 12, wherein the field correction unit further comprises at least one magnetic field sensor.

14. An apparatus according to claim 13, wherein the at least one magnetic field sensor comprises a Hall sensor or a NMR-type sensor.

15. An apparatus according to claim 13, wherein the at least one magnetic field sensor is placed at a predetermined radial distance with respect to a central axis of the room temperature bore.

16. An apparatus according to claim 12, wherein the field correction unit comprises at least one subset of coils configured to generate an on-axis gradient field contribution of at least first order to a $B_z$ component of the auxiliary magnetic field.

17. An apparatus according to claim 16, wherein the field correction unit comprises at least two subsets of coils for generating on-axis gradient field contributions of at least first and second order to the $B_z$ component of the auxiliary magnetic field.

18. An apparatus according to claim 12, wherein the field correction unit comprises at least one subset of coils configured to generate an off-axis gradient field contribution to a $B_z$ component of the auxiliary magnetic field.

* * * * *